(12) United States Patent
Sawada et al.

(10) Patent No.: US 7,064,961 B2
(45) Date of Patent: Jun. 20, 2006

(54) COMMUNICATION DEVICE

(75) Inventors: Akira Sawada, Kanagawa (JP); Mitsuaki Hayashi, Kanagawa (JP); Hironori Tanaka, Kanagawa (JP); Kouichi Kuramitsu, Kanagawa (JP); Miyuki Hashimoto, Kanagawa (JP); Wataru Takano, Kanagawa (JP); Mitsuo Fujimura, Kanagawa (JP)

(73) Assignee: Fujitsu Limited, Kawasaki (JP)

( * ) Notice: Subject to any disclaimer, the term of this patent is extended or adjusted under 35 U.S.C. 154(b) by 857 days.

(21) Appl. No.: 09/952,246

(22) Filed: Sep. 14, 2001

(65) Prior Publication Data

US 2002/0176234 A1 Nov. 28, 2002

(30) Foreign Application Priority Data

May 22, 2001 (JP) ........................ 2001-152516

(51) Int. Cl.
*H01R 12/16* (2006.01)

(52) U.S. Cl. ........................ 361/788; 361/796
(58) Field of Classification Search ................ 361/788, 361/682, 683, 68, 807, 810, 792, 760, 720, 361/741, 748; 439/377, 74, 69
See application file for complete search history.

(56) References Cited

U.S. PATENT DOCUMENTS

| 4,401,351 A | | 8/1983 | Record |
| 4,477,862 A | * | 10/1984 | Gonzales .................... 361/686 |
| 4,974,192 A | | 11/1990 | Face et al. |
| 5,576,935 A | | 11/1996 | Freer et al. |
| 5,793,998 A | * | 8/1998 | Copeland et al. ........... 710/305 |
| 6,104,616 A | * | 8/2000 | Benson et al. .............. 361/724 |
| 6,127,748 A | * | 10/2000 | Girard et al. ............... 307/139 |
| 6,490,157 B1 | * | 12/2002 | Unrein ....................... 361/687 |
| 6,491,526 B1 | * | 12/2002 | Leman ....................... 439/61 |

FOREIGN PATENT DOCUMENTS

| EP | 0 425 192 | 5/1991 |
| GB | 2 162 667 | 2/1986 |
| GB | 2 219 694 | 12/1989 |
| GB | 2 223 884 | 4/1990 |
| GB | 2 235 592 | 3/1991 |
| GB | 2 271 440 | 4/1994 |
| GB | 2 292 820 | 3/1996 |
| GB | 2 300 056 | 10/1996 |
| WO | 01/93650 | 12/2001 |

* cited by examiner

*Primary Examiner*—Kamand Cuneo
*Assistant Examiner*—Thanh S. Phan
(74) *Attorney, Agent, or Firm*—Katten Muchin; Zavis Rosenman

(57) ABSTRACT

A communication device which is constructed so as to permit efficient mounting of cards such as printed boards, thereby enhancing convenience and economy and ensuring high-quality communications. A basic unit is constituted by a basic board having a common control section packaged thereon, and a basic back wiring board on which are arranged a basic card connector for mounting a detachable card unit for processing signals and a basic link connector for additionally connecting such a card unit and which has wiring formed on a substrate thereof. An extension unit is connected to the basic link connector to permit additional connection of the card unit.

4 Claims, 11 Drawing Sheets

COMMUNICATION DEVICE

BACKGROUND OF THE INVENTION (1) Field of the Invention

The present invention relates to a communication device, and more particularly, to a communication device having a card unit mounted thereon to perform communication control.

(2) Description of the Related Art

With the recent popularization of multimedia services, the development of subscriber transmission systems is advancing rapidly, creating an increasing demand for line terminating devices that achieve user-network interface. A line terminating device is installed in a user's home to carry out high-speed data transmission and includes, for example, a DSU (Digital Service Unit: digital line terminating device) for ISDN, an ONU (Optical Network Unit: optical subscriber line terminating device) used in optical access network for optical transmission, etc.

FIG. 11 shows an external appearance of a conventional line terminating device. A line terminating device 100 is constructed such that a plurality of printed boards are mounted to a shelf-like casing. The casing has guide rails 101 permitting individual printed boards to be inserted and detached, and a backboard 102 interconnecting the printed boards.

Printed boards to be mounted include two board types, a basic board 103 and a signal processing board 104. The basic board 103 is a printed board on which a station interface control section, a power supply, etc. are packaged, and the signal processing board 104 is a printed board for processing signals associated with various services.

A station interface cable 105 extends from the basic board 103 to be connected to a station, and terminal interface cables 106 extend from the respective signal processing boards 104 to be connected to terminals such as personal computers.

A blank board 107, which is mounted to an empty slot for the purpose of protection against EMI (Electro-Magnetic Interference), cuts off electromagnetic noise leaking to the air from the signal processing boards 104 and thereby prevents erroneous operation of electronic circuits on the other signal processing boards 104.

The conventional line terminating device 100 described above is, however, configured such that a space is reserved in advance to accommodate a pre-specified number of signal processing boards, and thus is associated with a problem that the device is large in size and poor in convenience and economy.

Also, since the line terminating device is installed in a home or an office, it is often difficult to find a suitable place to install the device with the conventional structure, and thus there is a strong demand for a smaller-sized device. Further, in the case of the conventional device, the backboard and connectors must be prepared in consideration of spare slots and also blank boards need to be mounted to empty slots, which leads to increased cost of the device.

SUMMARY OF THE INVENTION

The present invention was created in view of the above circumstances, and an object thereof is to provide a communication device which is so configured as to permit efficient mounting of printed boards, thereby enhancing convenience and economy and yet ensuring high-quality communications.

To achieve the above object, there is provided a communication device for performing communication control. The communication device comprises a detachable card unit for processing signals, a basic unit constituted by a basic board having a common control section packaged thereon and a basic back wiring board on which are arranged a basic card connector for mounting the card unit and a basic link connector for additionally connecting the card unit and which has wiring formed on a substrate thereof, and an extension unit including an extension back wiring board on which are arranged link connectors connected to the basic link connector or the link connector of another extension unit and a card connector for mounting the card unit and which has wiring formed on a substrate thereof, thereby permitting additional connection of the card unit.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

Figure 1:
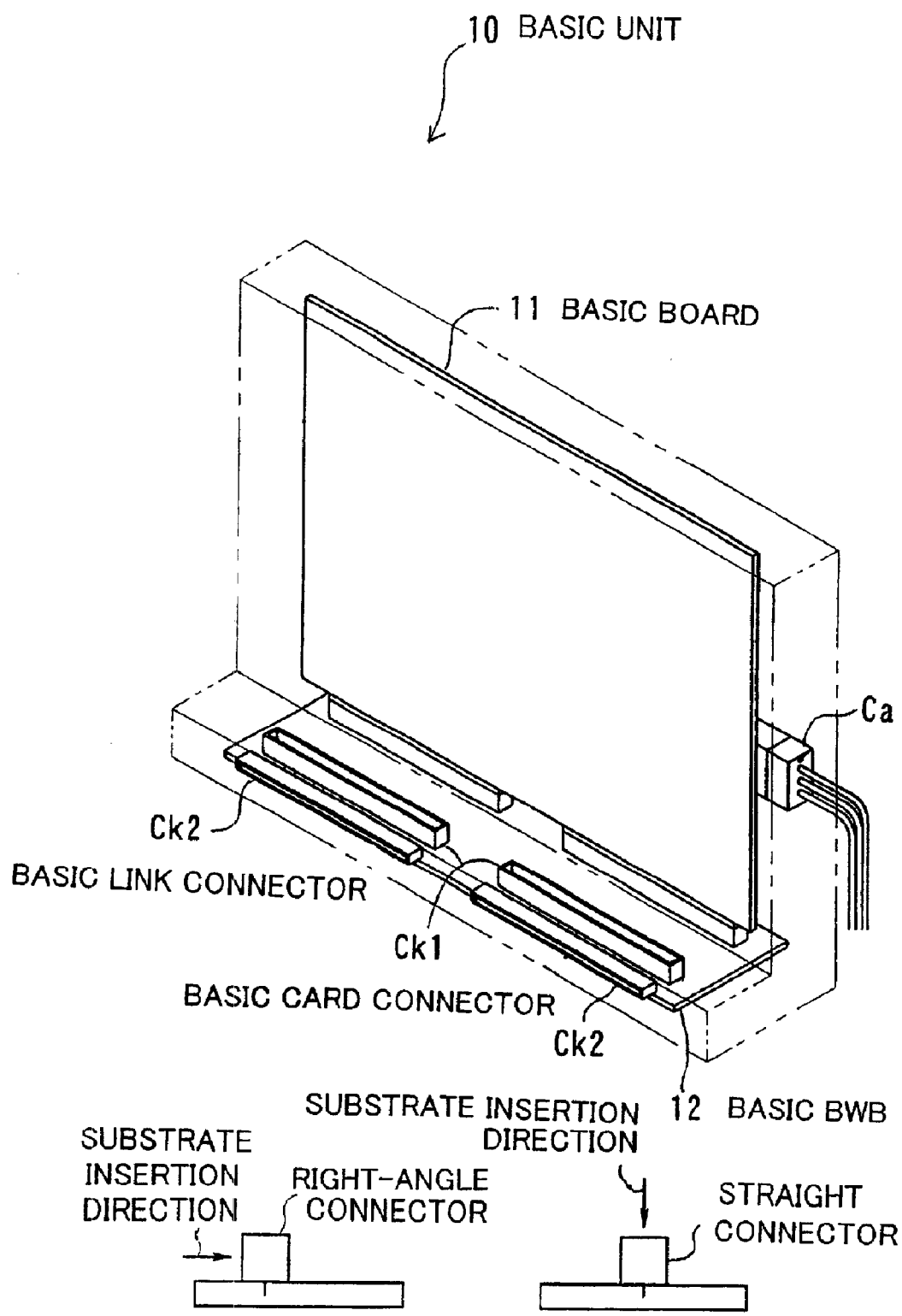
FIG. 1 is a view showing the construction of a communication device according to the present invention.
Figure 2:
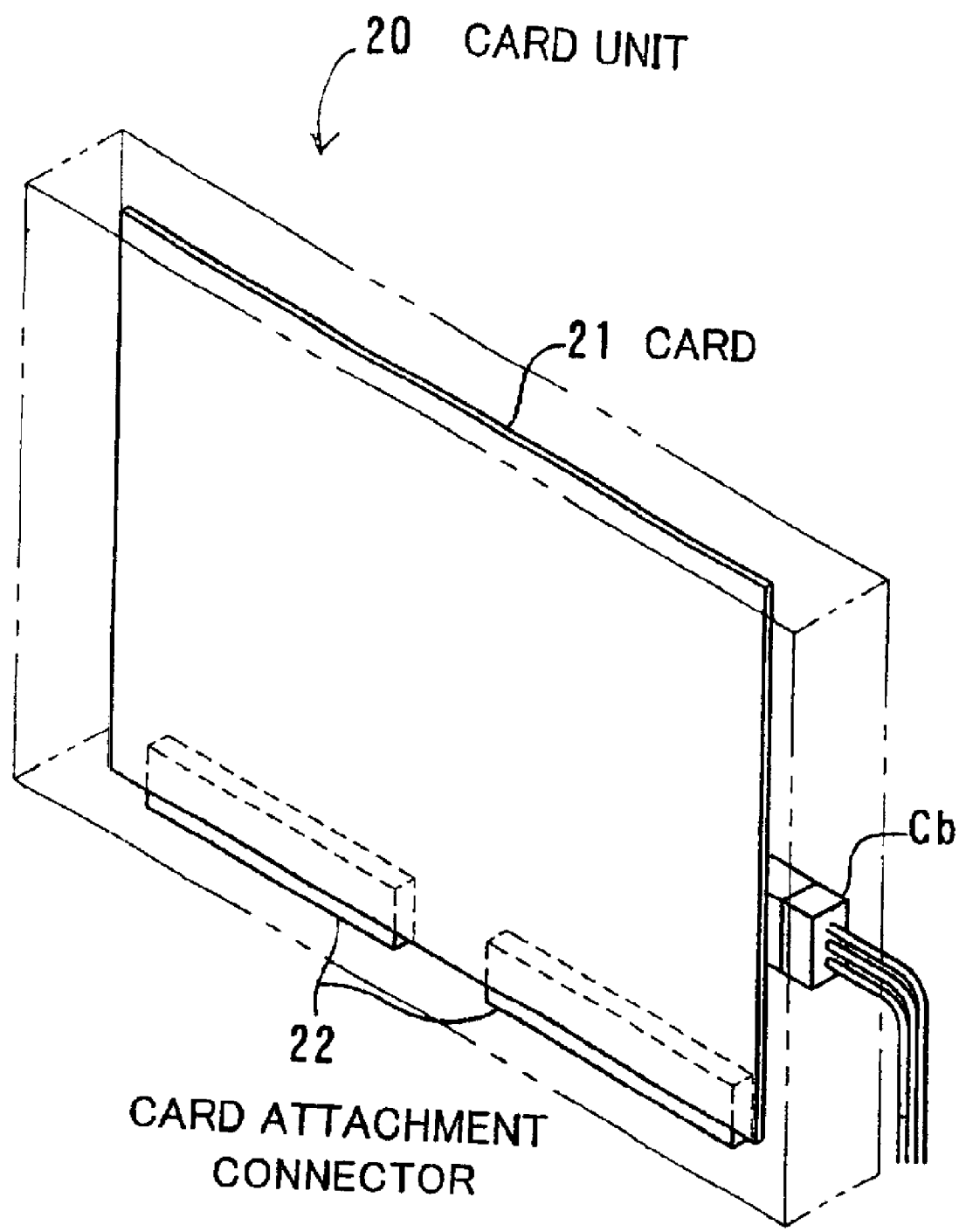
FIG. 2 is a view also showing the construction of the communication device of the present invention.
Figure 3:
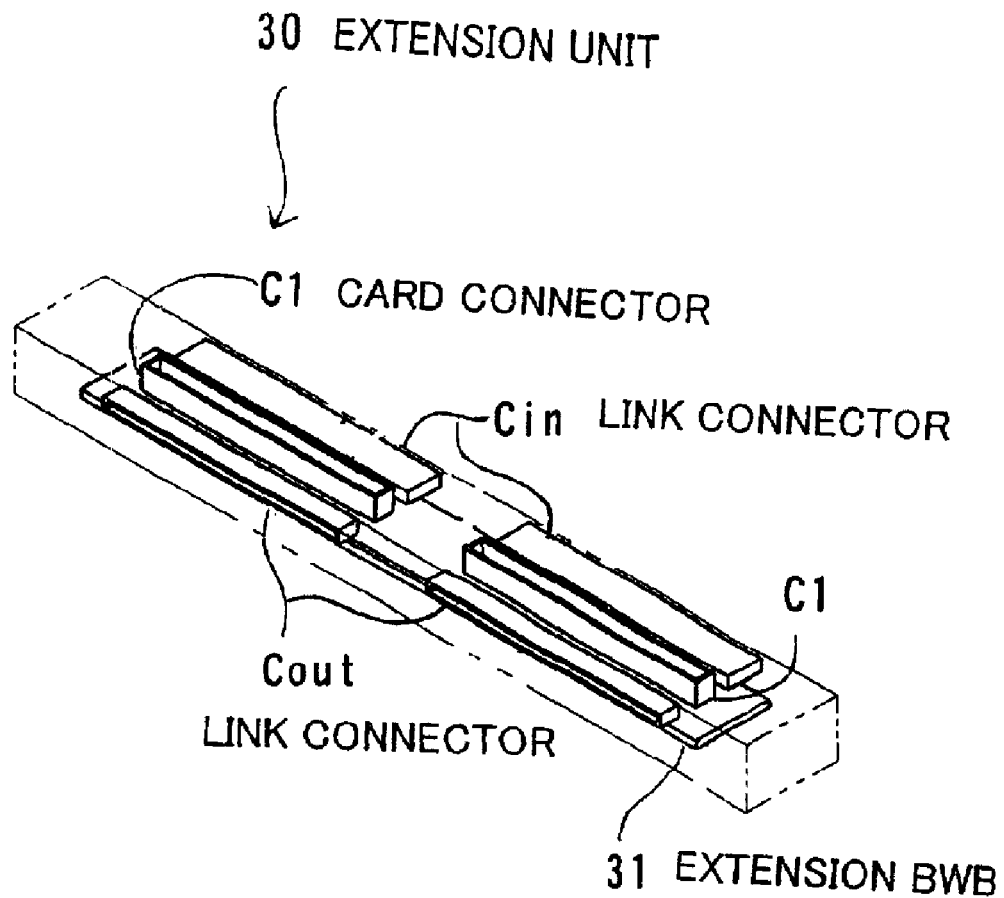
FIG. 3 is a view also showing the construction of the communication device of the present invention.

Embodiments of the present invention will be hereinafter described with reference to the drawings. FIGS. 1 to 3 illustrate the construction of a communication device according to the present invention. The communication device comprises a basic unit 10 (FIG. 1), a card unit 20 (FIG. 2), and an extension unit 30 (FIG. 3). In the following description, the communication device of the present invention is applied to a line terminating device, by way of example.

The basic unit 10 shown in FIG. 1 comprises a basic board 11 and a basic back wiring board 12. The basic back wiring board 12 is placed horizontally, and the basic board 11 is connected vertically to the basic back wiring board 12 through connectors. These boards are encased in a chassis such that the basic unit has an L-shaped structure as a whole.

The back wiring board is hereinafter referred to simply as BWB (Back Wiring Board).

The basic board 11 is connected with a station interface connector Ca. Also, on the basic board 11 are packaged an interface circuit for performing interface control of signals transmitted/received through cables connected to the station interface connector Ca, and a common control section (not shown) including a central control circuit, a power circuit, etc.

The basic BWB 12 has a straight type basic card connector Ck1 and a right-angle type basic link connector Ck2 arranged thereon such the basic card connector Ck1 and the basic link connector Ck2 are exposed respectively on an upper face of the horizontal portion of the L-shaped casing and on a face of the casing opposite the basic board 11.

The basic card connector Ck1 is a connector to which the card unit 20 (described later with reference to FIG. 2) is connected, while the basic link connector Ck2 is a connector to which the extension unit 30 (described later with reference to FIG. 3) is connected to permit additional connection of the card unit 20. Also, the basic BWB 12 has wiring formed thereon to connect the basic board 11 and the card unit 20 mounted thereon.

The card unit 20 shown in FIG. 2 has a card 21 connected with a terminal interface connector Cb and encased in a chassis. On the card 21 are mounted a card attachment connector 22 and a signal processing section (not shown) for processing signals transmitted/received through cables connected to the terminal interface connector Cb as well as signals exchanged with the basic board 11.

The card attachment connector 22 is a right-angle connector connected to the basic card connector Ck1 of the basic unit 10 or to a card connector C1 of the extension unit 30. The card unit 20 can be attached to and detached from the basic unit 10 or the extension unit 30 as desired.

The extension unit 30 shown in FIG. 3 has an extension BWB 31 on which link connectors Cin and Cout and a card connector C1 are arranged, and is encased in a chassis. Specifically, the input- and output-side link connectors Cin and Cout, both of a right-angle type, are mounted on opposite sides of the extension BWB 31, and the card connector C1 of straight type is mounted to a portion between the two link connectors.

The link connector Cin is connected to the basic ink connector Ck2 or the link connector Cout of another extension BWB, while the link connector Cout can be connected to the link connector Cin of another extension BWB so that a plurality of extension units 30 can be connected in stages. The card connector C1 is a connector to which the card attachment connector 22 is connected, thereby mounting the card unit 20 on the extension BWB. The extension BWB 31 also has wiring formed thereon to connect the basic board 11 and the card unit 20 mounted thereon. Details of the wiring pattern will be described later with reference to FIGS. 7 and 8.

In the case where the communication device constituted by the aforementioned units is applied to an ONU, the basic unit 10 receives optical fiber cables connected to the station side, and an optical/electrical conversion circuit, a power circuit, etc. are packaged on the basic board 11. The card unit 20 receives terminal interface cables connected to terminals such as personal computers. In this case, various card units 20 having different types of circuit components mounted thereon according to transmission speed/communication system are connected by means of the extension units 30 (only one card unit 20 may of course be connected).

Figure 4:
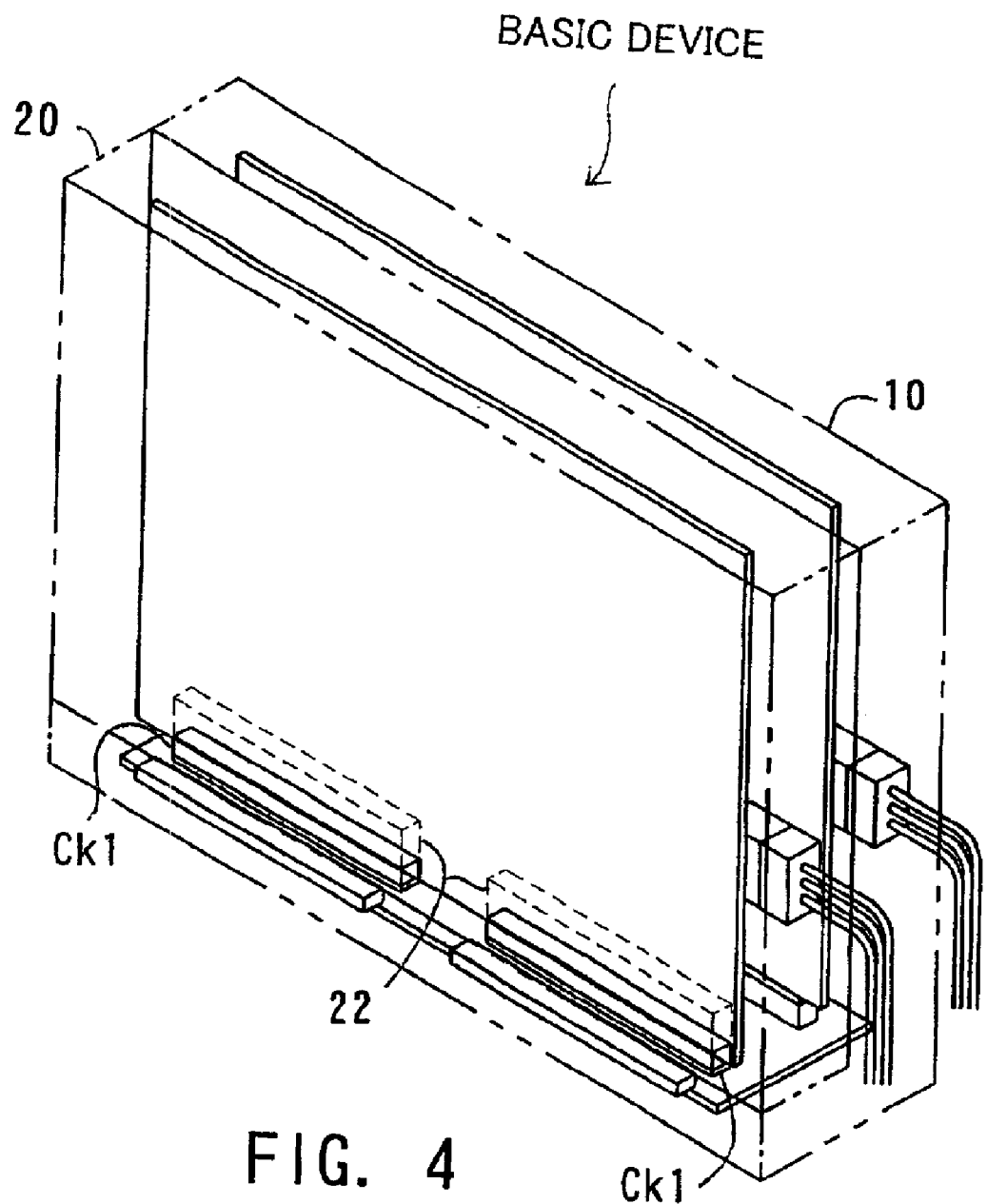
FIG. 4 is a view showing the construction of a basic device.

A basic device having one card unit 20 mounted to the basic unit 10 will be now described. FIG. 4 shows the construction of the basic device. The basic card connector Ck1 of the basic unit 10 and the card attachment connector 22 of the card unit 20 are connected to each other, so that the single card unit 20 is positioned in the space inside the L-shape of the basic unit 10. The two units assembled in this manner constitute a basic device, whereby the single card unit 20 can be put into operation.

Figure 5:
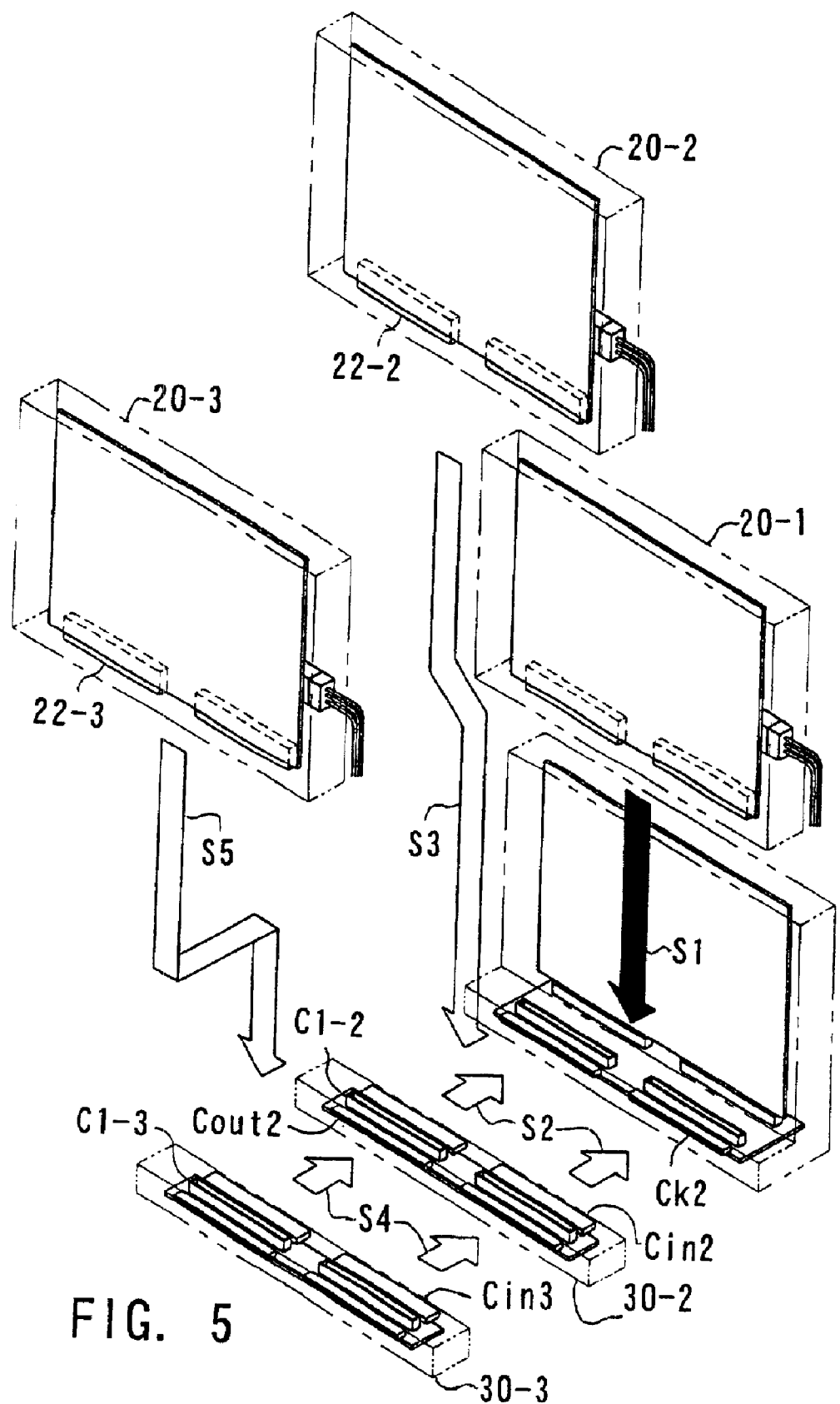
FIG. 5 is an assembly diagram illustrating how card units are additionally connected.
Figure 6:
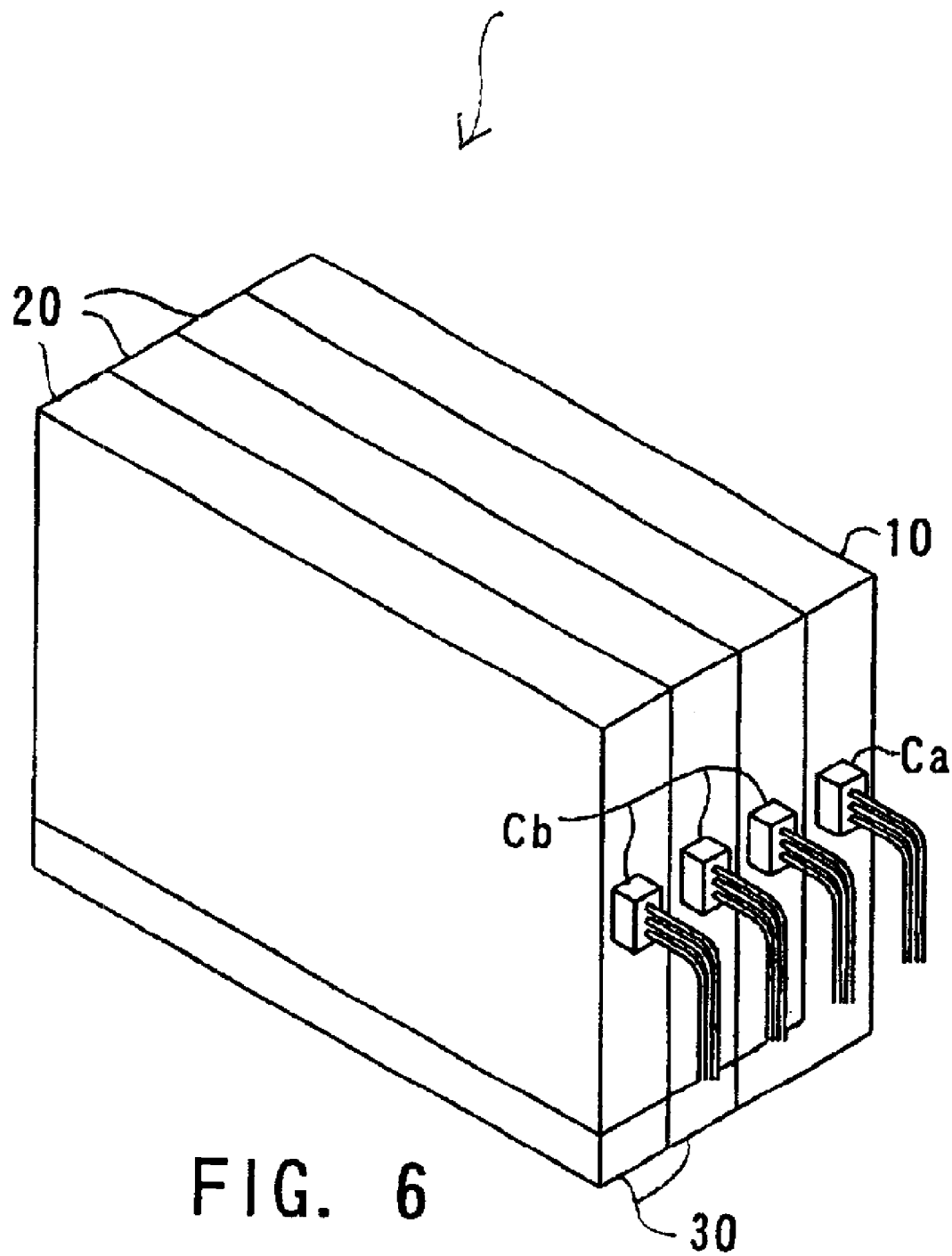
FIG. 6 is a view showing an external appearance of the communication device having three card units mounted thereto.

The manner of how additional card units 20 are connected will be now described. FIG. 5 shows the manner of assembling three card units 20, and FIG. 6 shows the external appearance of a communication device with three card units mounted thereon.

[S1] A card unit 20-1 is mounted to the basic unit 10 in the manner described above with reference to FIG. 4, thereby constituting a basic device.

[S2] The input-side link connector Cin2 of an extension unit 30-2 is connected to the basic link connector Ck2 of the basic unit 10.

[S3] The card connector C1-2 of the extension unit 30-2 and the card attachment connector 22-2 of a card unit 20-2 are connected to each other, thereby mounting the card unit 20-2 to the extension unit.

[S4] The input-side link connector Cin3 of an extension unit 30-3 is connected to the output-side link connector Cout2 of the extension unit 30-2.

[S5] The card connector C1-3 of the extension unit 30-3 and the card attachment connector 22-3 of a card unit 20-3 are connected to each other, thereby mounting the card unit 20-3. The assembling order may alternatively be such that the extension units 30 on which the respective card units 20 are mounted in advance are successively connected one after another.

Thus, by concatenating the extension units 30 to the basic unit 10, it is possible to mount n card units 20 so that the n card units 20 can be put into operation. In cases where a plurality of card units 20 are mounted, the card units 20 may have identical or different functions (the basic unit 10 is however configured to perform control operations matching the functions of the respective card units).

Figure 7:
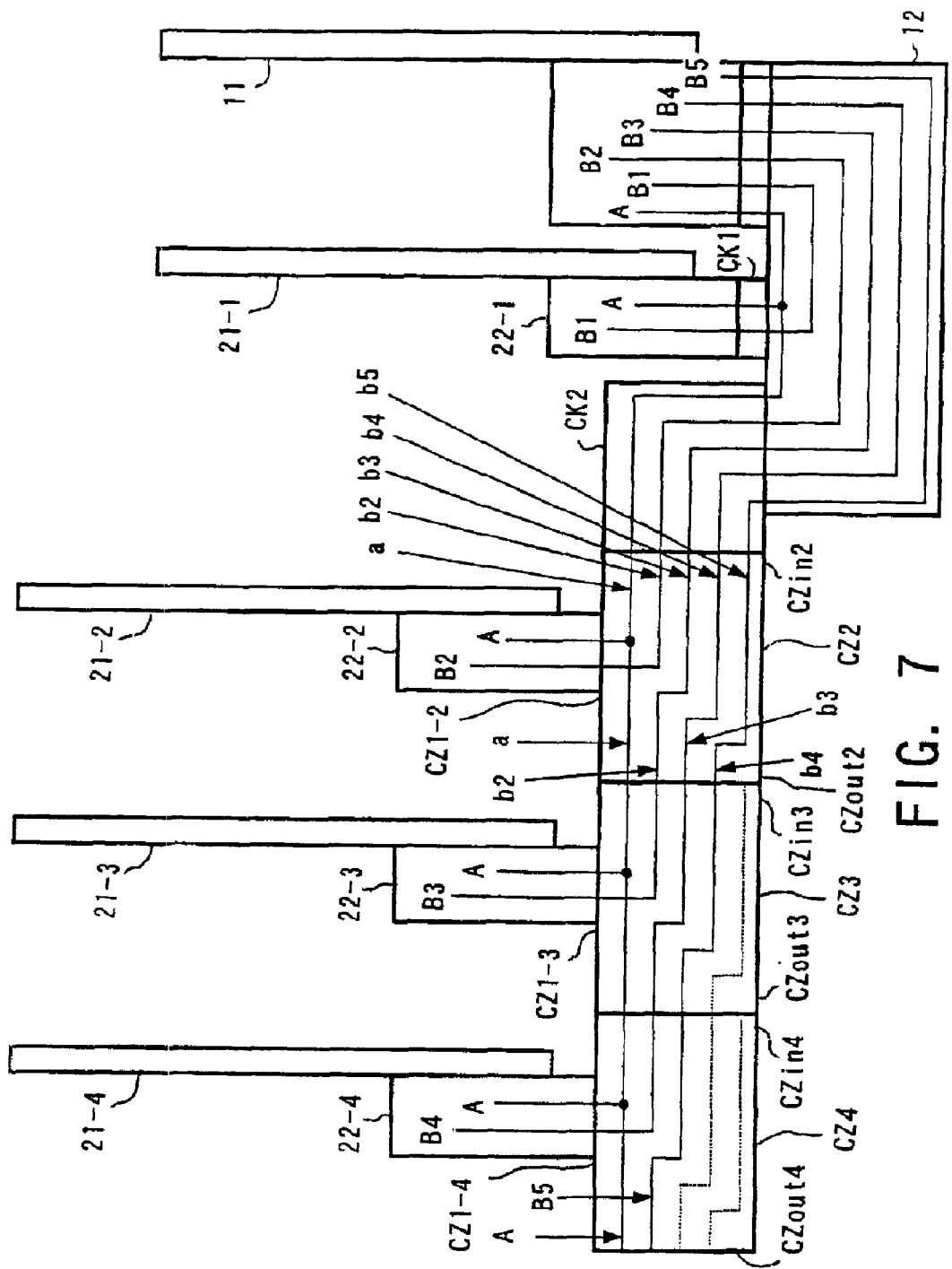
FIG. 7 is a diagram showing the configuration of connections of card units.
Figure 8:
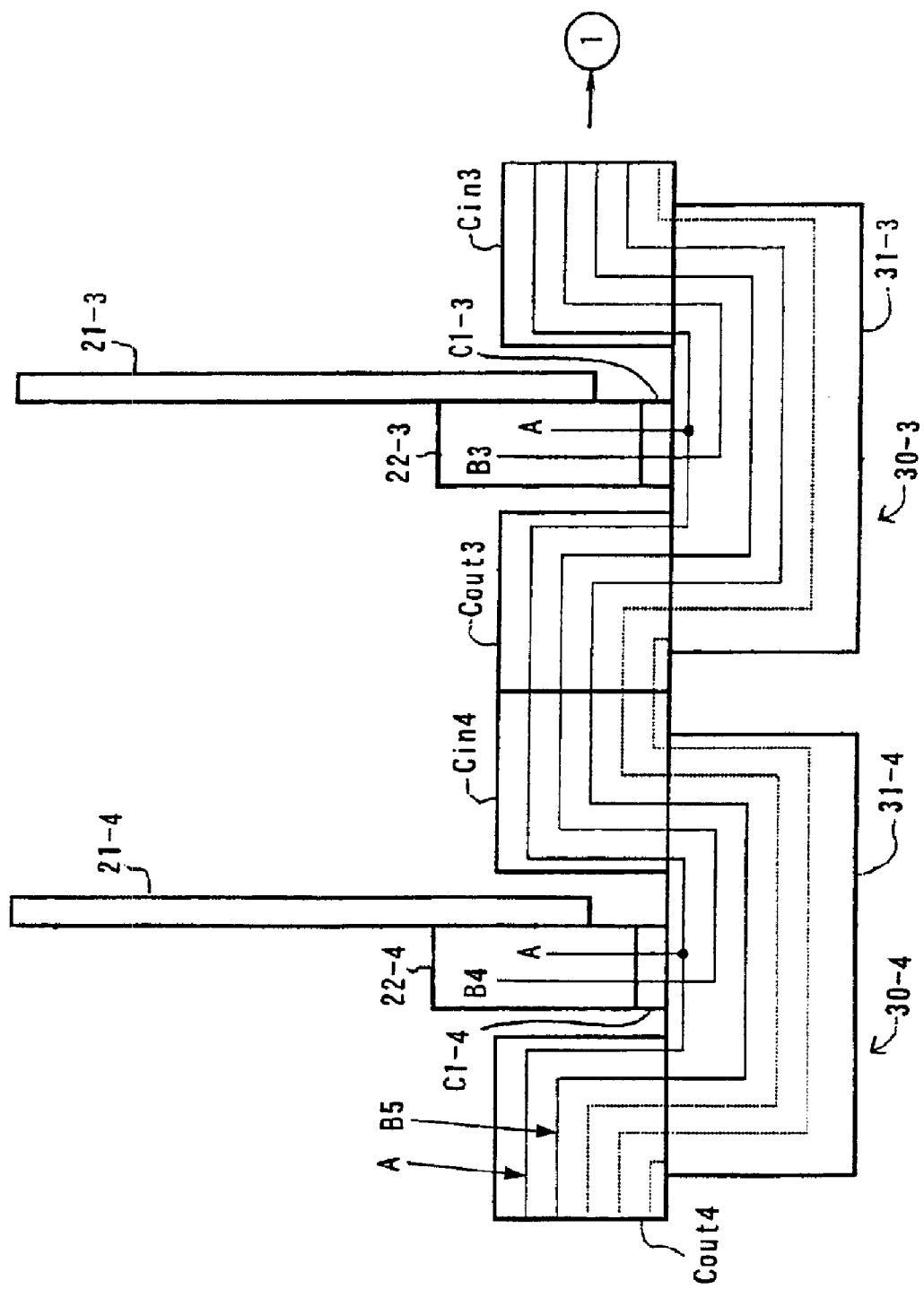
FIG. 8 is a diagram also showing the configuration of connections of the card units.

The configuration of connections of the card units 20 will be now described with reference to FIGS. 7 and 8. The figures show a state in which four cards 21-1 to 21-4 are connected to a basic board 11 capable of controlling five cards. Also, in the figures, only those parts which are necessary for the connections are illustrated for ease of understanding.

In the illustrated connections, the basic link connector Ck2 and the link connector Cin2 are connected to each other, the link connectors Cout2 and Cin3 are connected to each other, and the link connectors Cout3 and Cin4 are connected to each other.

Also, the card 21-1 is mounted with its card attachment connector 22-1 connected to the basic card connector Ck1, and the card 21-2 is mounted with its card attachment connector 22-2 connected to the card connector C1-2. Similarly, the card 21-3 is mounted with its card attachment connector 22-3 connected to the card connector C1-3, and the card 21-4 is mounted with its card attachment connector 22-4 connected to the card connector C1-4.

Signals connecting the basic board 11 and the cards 21-1 to 21-4 are classified into two types. One is a signal (hereinafter common signal A) connecting the basic board 11 and all cards in common such as power supply and earth, and the other is a signal connecting the basic board 11 and each of the cards in one-to-one correspondence.

The common signal A derived from the basic board 11 connects to the basic BWB 12 through the connectors and branches into two inside the basic BWB 12, one connecting to the card 21-1 through the basic card connector Ck1 and the other connecting to the extension BWB 31-2 through the basic link connector Ck2 and the link connector Cin2.

In the extension BWB 31-2, the common signal A branches into two, one connecting to the card 21-2 and the other connecting to the extension BWB 31-3 through the link connectors Cout2 and Cin3. Similarly, the common signal A branches into two inside the extension BWB 31-3, one connecting to the card 21-3 and the other connecting to the extension BWB 31-4 through the link connectors Cout3 and Cin4. The common signal A further branches into two inside the extension BWB 31-4, one connecting to the card 21-4 and the other connecting to the link connector Cout4.

On the other hand, the signal connecting to each of the cards in one-to-one correspondence includes a signal B1 connecting the basic board 11 and the card 21-1 through the basic BWB 12 and signals B2 to B4 connecting the basic board 11 and the respective cards 21-2 to 21-4.

The signal B2 connects to the card 21-2 via the route: basic board 11→basic BWB 12→extension BWB 31-2. The signal B3 connects to the card 21-3 via the route: basic board 11→basic BWB 12→extension BWB 31-2→extension BWB 31-3.

The signal B4 connects to the card 21-4 via the route: basic board 11→basic BWB 12→extension BWB 31-2→extension BWB 31-3→extension BWB 31-4. Generally speaking, a signal Bn is a signal connecting to a card 21-n and connects thereto via the route: basic board 11→basic BWB 12→extension BWB 31-2→ . . . →extension BWB 31-n. In FIGS. 7 and 8, the dotted lines indicate lines which are actually patterned but not used in the illustrated example.

Let us now consider the pin arrangement of the link connectors Cin and Cout on the extension BWB 31 by dividing the pins into pin blocks a and b2 to bn, n in total, corresponding to a total n of the common signal A and the signals B2 to Bn. The term "block" mentioned herein denotes a bundle of all signal lines that are required for the signal processing between substrates A and B, for example.

The common signal A enters the extension BWB 312 from the block a of the link connector Cin2 thereof and branches into two inside the extension BWB 31-2, one connecting to the card connector C1-2 and the other connecting to the block a of the link connector Cout2. The common signal A then connects to the other extension BWBs in like manner through the blocks a.

On the other hand, the signal B2 enters the extension BWB 31-2 from the block b2 of the link connector Cin2 and connects to the card connector C1-2. The signal B3 enters the extension BWB 31-2 from the block b3 of the link connector Cin2 and connects to the block b2 of the link connector Cout2. Then, the signal B3 enters the extension BWB 31-3 from the block b2 of the link connector Cin3 and connects to the card connector C1-3.

Similarly, the signal B4 enters the extension BWB 31-2 from the block b4 of the link connector Cin2 and connects to the block b3 of the link connector Cout2. Then, the signal B4 enters the extension BWB 31-3 from the block b3 of the link connector Cin3 and connects to the block b2 of the link connector Cout3. The signal B4 further enters the extension BWB 31-4 from the block b2 of the link connector Cin4 and connects to the card connector C1-4.

Owing to the connections configured as described above, when the link connector Cin3 of the extension BWB 31-3 is connected to the link connector Cout2 of the extension BWB 31-2, the signals B3 to Bn connect to the blocks b2 to bn-1, respectively, of the link connector Cin3 (in the illustrated example, the blocks b2 to b4 of the link connector Cin3 correspond to the signals B3 to B5, respectively).

Similarly, when the extension BWB 31-4 is connected to the extension BWB 31-3, the signals B4 to Bn connect to the blocks b2 to bn-2, respectively, of the link connector Cin4 of the extension BWB 31-4 (in the illustrated example, the blocks b2 and b3 of the link connector Cin4 correspond to the signals B4 and B5, respectively).

Thus, when an extension BWB 31(n) is connected to an extension BWB 31(n-1) in concatenating extension BWBs 31, the signal Bn can be made to connect to the block b2 of the input-side link connector Cin of the extension BWB 31(n).

As explained above, the extension unit 30 of the present invention has wiring thereof configured in a manner such that a first pin block of the input-side link connector Cin necessary for the connection of one card is connected to the card connector C1 while a second pin block other than the first pin block is shifted by one block between the link connectors Cin and Cout.

For example, the signal B2 enters the extension BWB 31-2 from the block b2 (corresponding to the first pin block) of the link connector Cin2 and connects to the card connector C1-2. The signals B3 to B5 enter the extension BWB 31-2 from the respective blocks b3 to b5 (corresponding to the second pin block) of the link connector Cin2 and connect to the blocks of the link connector Cout2 shifted by one block, that is, the blocks b2 to b4, respectively.

This configuration of connections makes it unnecessary to fabricate extension units uniquely designed for the respective types of card units and thus the card units 20 can be connected freely by simply using the extension units 30 having an identical wiring pattern, permitting efficient extension of card units.

Figure 9:
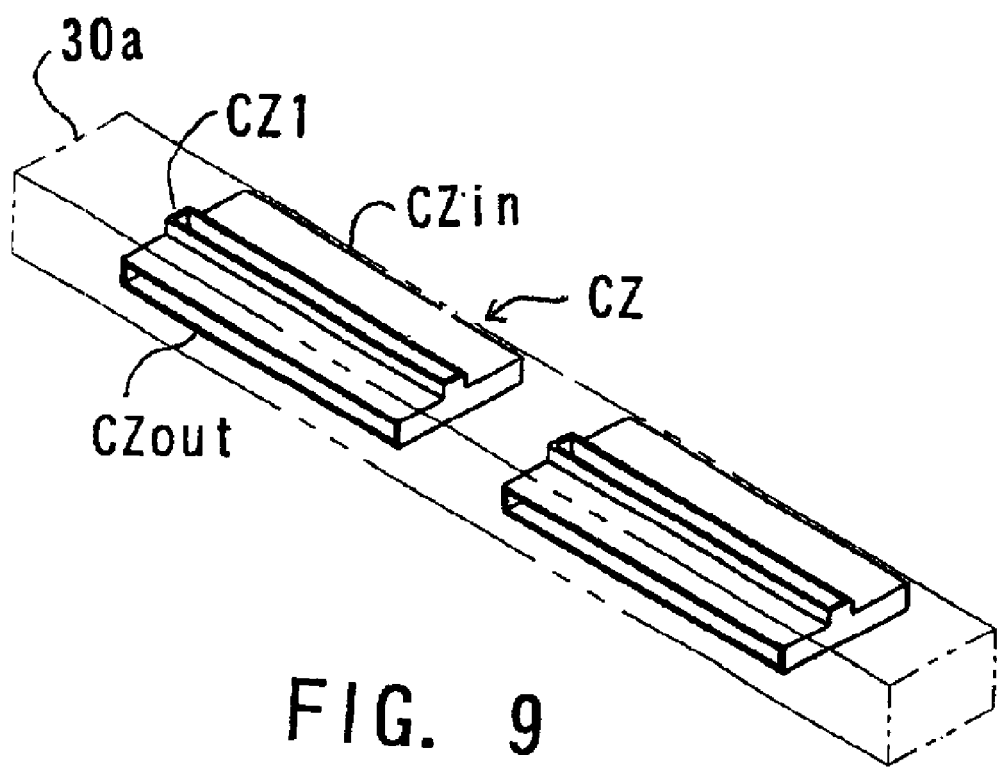
FIG. 9 is a view showing a modification of an extension unit.

A modification of the extension unit 30 will be now described with reference to FIG. 9. An extension unit 30a according to this modification has an extension connector CZ, which has the aforementioned link connectors Cin, Cout and card connector C1 formed into a one-piece body and is encased in a chassis. Also, inside the extension connector CZ is formed a wiring pattern similar to that of the extension BWB 31 explained above with reference to FIGS. 7 and 8.

In the following description of the configuration of connections, the connector port of the extension connector CZ corresponding to the link connector Cin is referred to as an extension link connector CZin, the connector port corresponding to the link connector Cout is referred to as an extension link connector CZout, and the connector port corresponding to the card connector C1 is referred to as an extension card connector CZ1.

Figure 10:
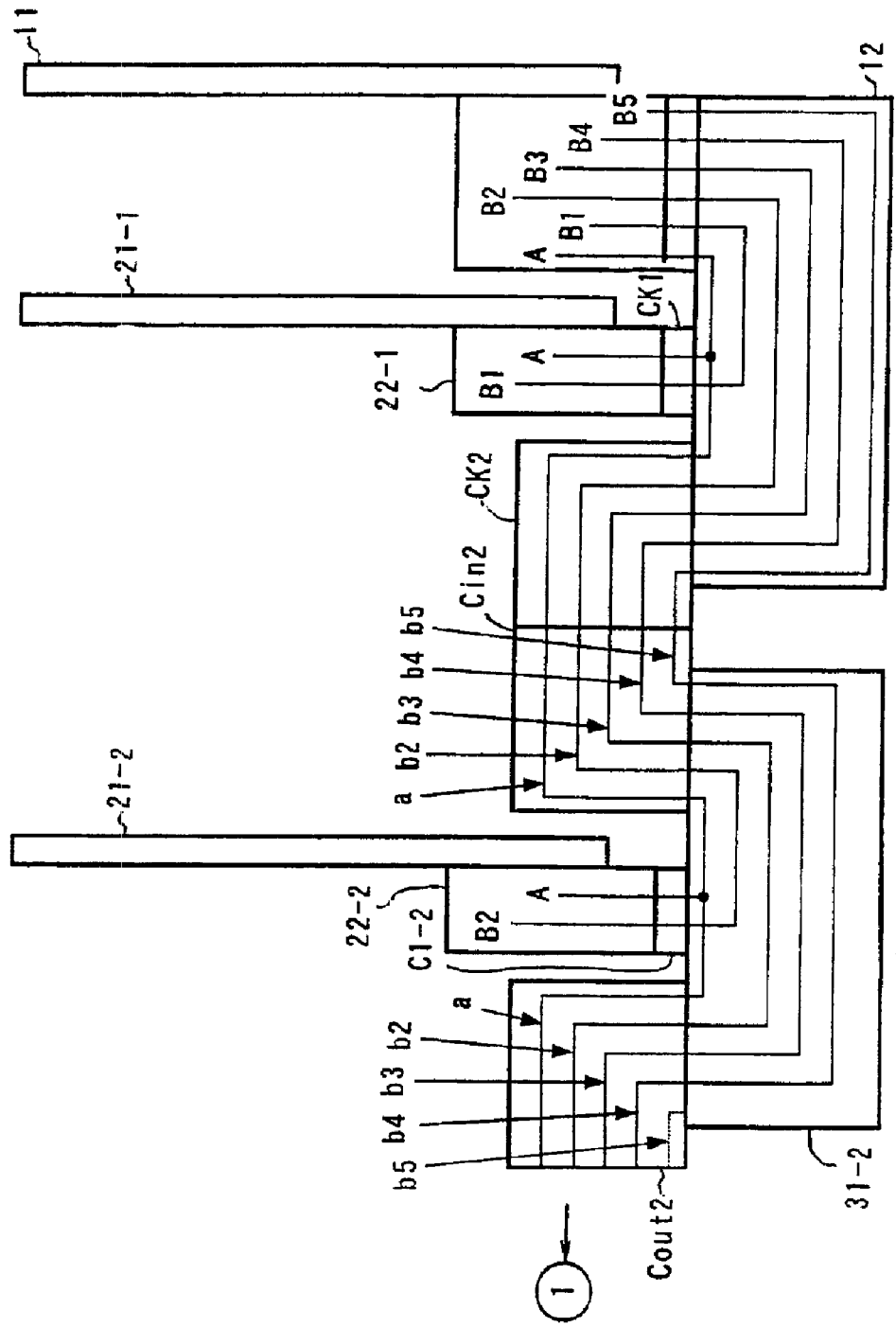
FIG. 10 is a diagram showing the configuration of connections of card units mounted using the extension units according to the modification.
Figure 11:
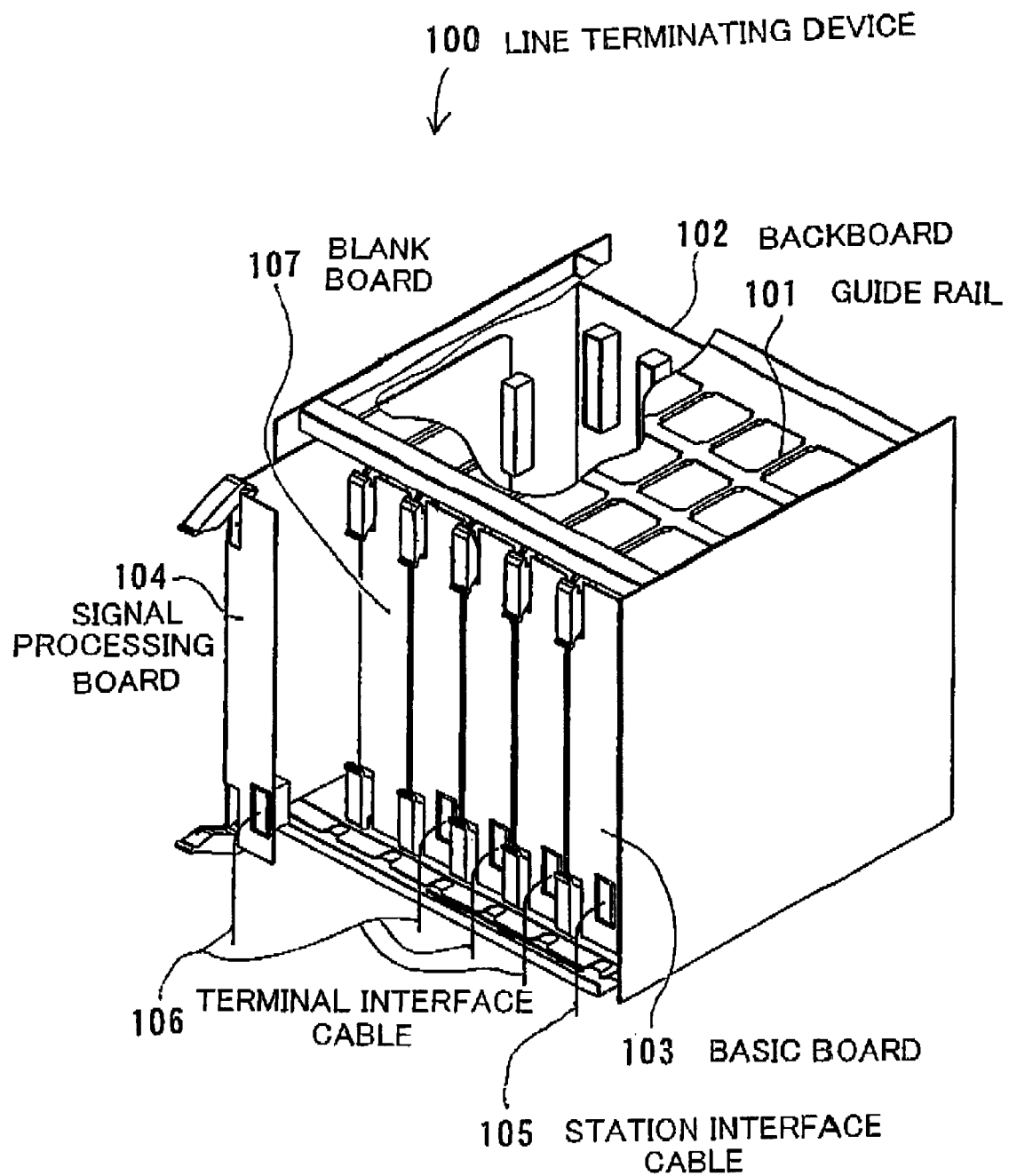
FIG. 11 is a view showing an external appearance of a conventional line terminating device.

FIG. 10 illustrates the manner of how the card units 20 are connected using the extension units 30a according to the modification. The figure shows a state in which four cards 21-1 to 21-4 are connected to a basic board 11 capable of controlling five cards. Also, in the figure, only those parts which are necessary for the connections are illustrated for ease of understanding.

In the connections as illustrated, the basic link connector Ck2 and an extension link connector CZin2 are connected to each other, extension link connectors CZout2 and CZin3 are connected to each other, and extension link connectors CZout3 and CZin4 are connected to each other.

Also, the card 21-1 is mounted with its card attachment connector 22-1 connected to the basic card connector Ck1, and the card 21-2 is mounted with its card attachment connector 22-2 connected to the extension card connector CZ1-2. Similarly, the card 21-3 is mounted with its card attachment connector 22-3 connected to the extension card connector CZ1-3, and the card 21-4 is mounted with its card attachment connector 22-4 connected to the extension card connector CZ1-4.

The common signal A derived from the basic board 11 enters the basic BWB 12 through the connectors and branches into two inside the basic BWB 12, one connecting to the card 21-1 through the basic card connector Ck1 and the other connecting to the extension link connector CZin2 through the basic link connector Ck2.

In the extension connector CZ2, the common signal A branches into two, one connecting to the card 212 and the other connecting to the extension link connector CZout2. Similarly, the common signal A branches into two inside the extension connector CZ3, one connecting to the card 21-3 and the other connecting to the extension link connector CZout3. The common signal A further branches into two inside the extension connector CZ4, one connecting to the card 21-4 and the other connecting to the extension link connector CZout4.

The signal connecting to each of the cards in one-to-one correspondence includes a signal B1 connecting the basic board 11 and the card 21-1 through the basic BWB 12 and signals B2 to B4 connecting the basic board 11 and the respective cards 21-2 to 21-4.

The signal B2 connects to the card 21-2 via the route: basic board 11→basic BWB 12→extension connector CZ2. The signal B3 connects to the card 21-3 via the route: basic board 11→basic BWB 12→extension connector CZ2 extension connector CZ3.

The signal B4 connects to the card 21-4 via the route: basic board 11→basic BWB 12→extension connector CZ2→extension connector CZ3→extension connector CZ4.

Let us now consider the pin arrangement of the extension link connectors CZin and CZout by dividing the pins into pin blocks a and b2 to bn, n in total, corresponding to a total n of the common signal A and the signals B2 to Bn.

The common signal A enters the extension connector CZ2 from the block a of the extension link connector CZin2 thereof and branches therein into two, one connecting to the extension card connector CZ1-2 and the other connecting to the block a of the extension link connector CZout2. The common signal A then connects to the other extension connectors in like manner through the blocks a.

On the other hand, the signal B2 enters the extension connector CZ2 from the block b2 of the extension link connector CZin2 and connects to the extension card connector CZ1-2. The signal B3 enters the extension connector CZ2 from the block b3 of the extension link connector CZin2 and connects to the block b2 of the extension link connector CZout2. Then, the signal B3 enters the extension connector CZ3 from the block b2 of the extension link connector CZin3 and connects to the extension card connector CZ1-3.

Similarly, the signal B4 enters the extension connector CZ2 from the block b4 of the extension link connector CZin2 and connects to the block b3 of the extension link connector CZout2. Then, the signal B4 enters the extension connector CZ3 from the block b3 of the extension link connector CZin3 and connects to the block b2 of the extension link connector CZout3. The signal B4 further enters the extension connector CZ4 from the block b2 of the extension link connector CZin4 and connects to the extension card connector CZ1-4.

Due to this configuration of connections, when the extension connector CZ3 is connected to the extension connector CZ2, the signals B3 to Bn connect to the blocks b2 to bn-1, respectively, of the extension link connector CZin3 (in the illustrated example, the blocks b2 to b4 of the extension link connector CZin3 correspond to the signals B3 to B5, respectively).

Similarly, when the extension connector CZ4 is connected to the extension connector CZ3, the signals B4 to Bn connect to the blocks b2 to bn-2, respectively, of the extension link connector CZin4 (in the illustrated example, the blocks b2 and b3 of the extension link connector CZin4 correspond to the signals B4 and B5, respectively).

Thus, when an extension connector CZ(n) is connected to an extension connector CZ(n-1) in concatenating extension connectors CZ, the signal Bn can be made to connect to the block b2 of the input-side extension link connector CZin of the extension connector CZ(n).

Such a configuration of connections makes it unnecessary to fabricate extension units uniquely designed for the respective types of card units and thus the card units 20 can be connected freely by simply using the extension units 30a having an identical wiring pattern, permitting efficient extension of card units. Also, the extension unit 30a according to the modification has the aforementioned wiring formed inside the extension connector and uses no BWB, thus making it possible to further reduce the size of the device.

As described above, according to the present invention, the extension units 30 are connected in series to the basic link connector Ck2 of the basic unit 10 in a manner external to the basic unit 10, to permit extension of card units 20 having identical or different functions. This makes it unnecessary to previously provide a space in the device large enough to accommodate a pre-specified number of extension cards or to provide extension connectors etc., unlike the conventional device, and also since no blank boards are required, the device can be reduced in size as well as in cost.

Also, in cases where any of one to n card units 20 has developed fault or needs to be replaced with a card unit 20 with a different function, the construction of the present invention permits only the card unit 20 requiring replacement to be smoothly replaced while leaving the extension unit 30 connected, without affecting the operation of the other card units 20.

Further, the pin blocks of the extension unit 30 are shifted by one block between the input- and output-side link connectors. This permits the card units 20 to be connected freely by using the extension units 30 having an identical wiring pattern, thus improving the mass productivity of the extension units 30.

Also, where the BWB pattern is replaced with a connector terminal as in the extension unit 30a according to the modification, it is possible to obtain a function equivalent to that of the extension unit 30 without using the BWB, so that the size of the device can be further cut down.

In the foregoing description, the extension unit 30, 30a has a wiring pattern that enables exchange of signals between the basic unit 10 and the card unit 20, but another wiring pattern enabling exchange of signals among a plurality of card units 20 may also be incorporated.

Also, in the above description, the communication device of the present invention is applied to a line terminating device, by way of example. The application of the present invention is, however, not limited to the line terminating device and the invention can be applied to a wide range of electronic devices to which additional cards need to be connected.

As described above, the communication device of the present invention is constructed such that the extension units, each including link connectors, a card connector and an extension back wiring board, are connected in series to the basic unit which includes a basic board having a common control section packaged thereon, to permit card units to be mounted on the respective extension units. Thus, card units for processing signals can be mounted with high efficiency, whereby the system can be reduced in size and cost, convenience and economy can be improved, and high-quality communications can be performed.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A communication device for performing communication control, comprising:
    a detachable card unit for processing signals;
    a basic unit constituted by a basic board having a common control section packaged thereon, and a basic back wiring board on which are arranged a basic card connector for mounting the card unit and a basic link connector for additionally connecting the card unit and which has wiring formed on a substrate thereof; and
    an extension unit including an extension back wiring board on which are arranged link connectors detachably connectable to the basic link connector or the link connector of another extension unit, and a card connector for mounting the card unit and which has wiring formed on a substrate thereof, thereby permitting an additional connection for a card unit,
    wherein said extension back wiring board of said extension unit has wiring configured in a manner such that a first pin blcok of an input side link connector is connected to said card connector of the extension unit, and that a second pin block of said input side link connector, other than the first pin block, is connected to a pin block position shifted by one block of an output side link connector.

2. The communication device according to claim 1, wherein said basic unit and one said card unit are combined to constitute a device for operating said one card unit, and a plurality of said card units are connected to said basic unit by using a plurality of said extension units, to constitute a device for operating said plurality of card units.

3. The communication device according to claim 1, wherein said extension unit includes an extension connector which has the link connectors and the card connector formed into a one-piece body and in which the wiring configuration of the extension back wiring board is incorporated.

4. The communication device according to claim 1, wherein said card unit receives a terminal interface cable connected to a subscriber terminal, and said basic unit receives a station interface cable connected to a station.

* * * * *